US008683399B2

(12) United States Patent
Hosoda

(10) Patent No.: US 8,683,399 B2
(45) Date of Patent: Mar. 25, 2014

(54) TIMING CONSTRAINT GENERATING SUPPORT APPARATUS AND METHOD OF SUPPORTING GENERATION OF TIMING CONSTRAINT

(71) Applicant: Fujitsu Limited, Kawasaki (JP)

(72) Inventor: Tomohiro Hosoda, Toyohashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/723,810

(22) Filed: Dec. 21, 2012

(65) Prior Publication Data

US 2013/0191800 A1 Jul. 25, 2013

Related U.S. Application Data

(63) Continuation of application No. PCT/JP2010/060569, filed on Jun. 22, 2010.

(51) Int. Cl.
*G06F 17/50* (2006.01)
(52) U.S. Cl.
USPC .......................................... 716/104; 716/100
(58) Field of Classification Search
USPC .................................................. 716/100, 104
See application file for complete search history.

(56) References Cited

U.S. PATENT DOCUMENTS

| 5,956,257 | A * | 9/1999 | Ginetti et al. ................. 716/103 |
| 2005/0120271 | A1 | 6/2005 | Higuchi |
| 2005/0251780 | A1 | 11/2005 | Nakashiba |
| 2006/0265678 | A1 | 11/2006 | Okabe |
| 2009/0210841 | A1* | 8/2009 | Prakash et al. ..................... 716/6 |
| 2009/0271750 | A1* | 10/2009 | Richardson et al. ............. 716/6 |
| 2011/0252388 | A1* | 10/2011 | Singhal et al. ................ 716/108 |

FOREIGN PATENT DOCUMENTS

| JP | 11-121626 | 4/1999 |
| JP | 2000-276499 | 10/2000 |
| JP | 2001-67383 | 3/2001 |
| JP | 2002-215711 | 8/2002 |
| JP | 2003-67442 | 3/2003 |
| JP | 2005-122578 | 5/2005 |
| JP | 2005-149373 | 6/2005 |
| JP | 2005-321980 | 11/2005 |
| JP | 2006-323643 | 11/2006 |

OTHER PUBLICATIONS

International Search Report of Corresponding PCT Application PCT/JP2010/060569 mailed Aug. 3, 2010.

* cited by examiner

*Primary Examiner* — Thuan Do
*Assistant Examiner* — Magid Dimyan
(74) *Attorney, Agent, or Firm* — Staas & Halsey LLP

(57) ABSTRACT

A timing constraint generating support apparatus includes a propagation unit that propagates, through a wire connecting the logic circuits, timing constraints set for the logic circuits by using circuit information that represents information relating to the logic circuits and connection information that represents information of the wire, a determination unit that determines whether or not a plurality of timing constraints different from each other are propagated through the wire by the propagation unit, and an output unit that outputs information representing that the timing constraints propagated through the wire overlap each other in a case where the plurality of timing constraints different from each other are determined to be propagated through the wire by the determination unit.

8 Claims, 16 Drawing Sheets

FIG.2

```
module sample1(DATA_IN_A, DATA_IN_B,);
input [0:7] DATA_IN_A;
input [0:7] DATA_IN_B;

wire n_0;
wire n_1;
wire n_2;
wire n_3;
wire n_4;
wire n_5;
wire n_6;
wire n_7;

SCVOR20010 inst_A0(.Y(n_0), .A(DATA_IN_A[0]), .B(DATA_IN_B[0]))
SCVOR20010 inst_A1(.Y(n_1), .A(DATA_IN_A[1]), .B(DATA_IN_B[1]))
SCVOR20010 inst_A2(.Y(n_2), .A(DATA_IN_A[2]), .B(DATA_IN_B[2]))
SCVOR20010 inst_A3(.Y(n_3), .A(DATA_IN_A[3]), .B(DATA_IN_B[3]))
SCVOR20010 inst_A4(.Y(n_4), .A(DATA_IN_A[4]), .B(DATA_IN_B[4]))
SCVOR20010 inst_A5(.Y(n_5), .A(DATA_IN_A[5]), .B(DATA_IN_B[5]))
SCVOR20010 inst_A6(.Y(n_6), .A(DATA_IN_A[6]), .B(DATA_IN_B[6]))
SCVOR20010 inst_A7(.Y(n_7), .A(DATA_IN_A[7]), .B(DATA_IN_B[7]))

Module_A inst_B(A{DATA_IN_A[0], DATA_IN_A[1], DATA_IN_A[2], DATA_IN_A[3],
            DATA_IN_A[4], DATA_IN_A[5], DATA_IN_A[6], DATA_IN_A[7]},
        B{DATA_IN_B[0], DATA_IN_B[1], DATA_IN_B[2], DATA_IN_B[3],
            DATA_IN_B[4], DATA_IN_B[5], DATA_IN_B[6], DATA_IN_B[7]}.
        C{n_0, n_1, n_2, n_3, n_4, n_5, n_6, n_7});
endmodule
```

FIG.3

```
set_multicycle_path 2 -setup -start -from [get_pins DATA_IN_A*]
set_multicycle_path 4 -setup -start -through [get_pins inst_B/C*]
```

FIG.8

| LOGIC INFOR-MATION | PROPAGATION CONDITION |
|---|---|
| or | IN CASE WHERE TIMING CONSTRAINT IS "0 FIXATION", PROPAGATION IS PERFORMED ONLY IN CASE WHERE TIMING CONSTRAINT OF WIRE INFORMATION RELATING TO OTHER INPUT PIN IS "0 FIXATION" PROPAGATION IS PERFORMED IN CASE WHERE TIMING CONSTRAINT IS OTHER THAN "0 FIXATION" |
| and | IN CASE WHERE TIMING CONSTRAINT IS "1 FIXATION", PROPAGATION IS PERFORMED ONLY IN CASE WHERE TIMING CONSTRAINT OF WIRE INFORMATION RELATING TO OTHER INPUT PIN IS "1 FIXATION" PROPAGATION IS PERFORMED IN CASE WHERE TIMING CONSTRAINT IS OTHER THAN "1 FIXATION" |
| not | IN CASE WHERE TIMING CONSTRAINT IS "0 FIXATION" OR "1 FIXATION", INVERTED VALUE IS PROPAGATED IN CASE WHERE TIMING CONSTRAINT IS OTHER THAN FIXATION, PROPAGATION IS PERFORMED |
| select | TIMING CONSTRAINT OF WIRE INFORMATION RELATING TO S0 PIN IS CHECKED IN CASE OF "0 FIXATION", TIMING CONSTRAINT OF WIRE INFORMATION RELATING TO D0 PIN IS PROPAGATED IN CASE OF "1 FIXATION", TIMING CONSTRAINT OF WIRE INFORMATION RELATING TO D1 PIN IS PROPAGATED IN CASE OF NO FIXATION, PROPAGATION IS PERFORMED |
| ff | PROPAGATION IS NOT PERFORMED |
| null | PROPAGATION IS NOT PERFORMED |

US 8,683,399 B2

TIMING CONSTRAINT GENERATING SUPPORT APPARATUS AND METHOD OF SUPPORTING GENERATION OF TIMING CONSTRAINT

CROSS-REFERENCE TO RELATED APPLICATION

This application is a continuation of International Application No. PCT/JP2010/060569, filed on Jun. 22, 2010 and designating the U.S., the entire contents of which are incorporated herein by reference.

FIELD

The embodiments discussed herein are directed to a timing constraint generating support apparatus and a method of supporting generation of timing constraints.

BACKGROUND

Conventionally, large-scale circuits are developed in which many functions are put into one large scale integration (LSI). In the development of such large-scale circuits, circuits are developed for each module by a plurality of logic designers. In a case where large-scale circuits are developed for each module, there are cases where wiring for connecting modules is difficult to be made in accordance with an increase in the scale of circuits. In order to extract such a problem in an early step and solve the extracted problem, a layout process and logic design are repeated by a developer in a state in which the specifications of circuits are undetermined.

In the layout process of such a large-scale circuit, a static timing analysis is performed in which it is determined whether or not a timing violation occurs using circuit information of each module and timing constraints applied to each module. In such a static timing analysis, an information processing apparatus is used, which determines whether or not a timing violation occurs using the circuit information and the timing constraints.

Here, an example of layout process will be described using FIG. 14. FIG. 14 is a flowchart that is used for describing the example of layout process. In the example of the layout process illustrated in FIG. 14, specifications are determined for each module in Step S1, logic design is performed in Step S2, timing constraints are generated in Step S3, and thereafter, logic synthesis of the modules is performed in Step S4. Then, after the entire circuit is built up in Step S5, in order to determine whether or not a timing violation occurs, a static timing analysis using an information processing apparatus is performed in Step S6.

In a case where a timing violation is determined not to have occurred through the static timing analysis, each module is arranged and wired in Step S7, and the static timing analysis is performed again in Step S8. Thereafter, in a case where a timing violation does not occur in the re-static timing analysis, the timing of the entire circuit is fixed in Step S9.

Here, in a case where a design error is included in the circuit of a module or in a case where there is an error in the timing constraints, a timing violation occurs in which transmission timing and reception timing between modules are out of sync. In other words, in a case where there is a design error or in a case where there is an error in the timing constraints, the information processing apparatus that performs the static timing analysis detects an occurrence of a timing violation. In such a case, a developer determines whether or not the detected timing violation is an error detection that is caused by an error in the timing constraints in a manual manner.

Here, an example of static timing analysis will be described with reference to FIG. 15. FIG. 15 is a flowchart that illustrates the example of static timing analysis. For example, in the example illustrated in FIG. 15, the developer generates timing constraints of each module in Step S10. Then, the static timing analysis using the generated timing constraints and the circuit information of each module is performed by the information processing apparatus in Step S11.

In a case where it is determined that no timing violation occurs by the information processing apparatus (No in Step S12), the timing is fixed in Step S13. On the other hand, in a case where it is determined that a timing violation has occurred by the information processing apparatus (Yes in Step S12), the developer determines whether or not the cause of the timing violation is an error detection due to an error in the timing constraints in a manual manner in Step S14.

Then, in a case where the developer determines that the cause of the timing violation is an error detection due to an error in the timing constraints (Yes in Step S14), the developer corrects the timing constraints in Step S15. On the other hand, in a case where the developer determines that the cause of the timing constraints is not an error detection due to an error in the timing constraints (No in Step S14), each module circuit is corrected in Step S16.

Here, an example will be described with reference to FIGS. 16 to 18 in which a timing violation that is caused by an error in the timing constraints is detected. FIG. 16 is a diagram that illustrates an example of setting of timing constraints. FIG. 17 is a diagram that illustrates a range to which a multi-cycle is applied. FIG. 18 is a diagram that illustrates an overlap of timing constraints.

For example, in the example illustrated in FIG. 16, a timing constraint in which the output is in multi-cycle "4" is set in module A, and a timing constraint in which the input is in multi-cycle "2" is set in module C. In such a case, as denoted by α in FIG. 17, the range from module A to module C is an application range of the multi-cycle "4". In addition, as denoted by β in FIG. 17, the range from module A to module C and the range from module B to module C correspond to application ranges of multi-cycle "2".

As a result, as denoted by γ in FIG. 18, the range from module A to module C is applied with two different multi-cycles "2" and "4". In such a case, depending on a tool that is used for a static timing analysis, a different timing constraint is selected, and accordingly, a timing violation is detected.

Patent Document 1: Japanese Laid-open Patent Publication No. 2005-122578

However, in the above-described method of determining whether or not a static timing analysis is an error detection, it is determined by manpower whether or not the cause of the timing violation is an error in the timing constraints, and accordingly, there is a problem in that the number of man-hours taken for checking an error detection increases.

SUMMARY

According to an aspect of an embodiment, a timing constraint generating support apparatus includes a propagation unit that propagates, through a wire connecting the logic circuits, timing constraints set for the logic circuits by using circuit information that represents information relating to the logic circuits and connection information that represents information of the wire, a determination unit that determines whether or not a plurality of timing constraints different from each other are propagated through the wire by the propagation unit, and an output unit that outputs information representing that the timing constraints propagated through the wire overlap each other in a case where the plurality of timing constraints different from each other are determined to be propagated through the wire by the determination unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram that illustrates an example of circuit information;

FIG. 3 is a diagram that illustrates an example of timing constraints;

FIG. 8 is a diagram that illustrates an example of propagation conditions of a timing constraint;

DESCRIPTION OF EMBODIMENTS

Preferred embodiments of the present invention will be explained with reference to accompanying drawings.

[a] First Embodiment

Figure 1:
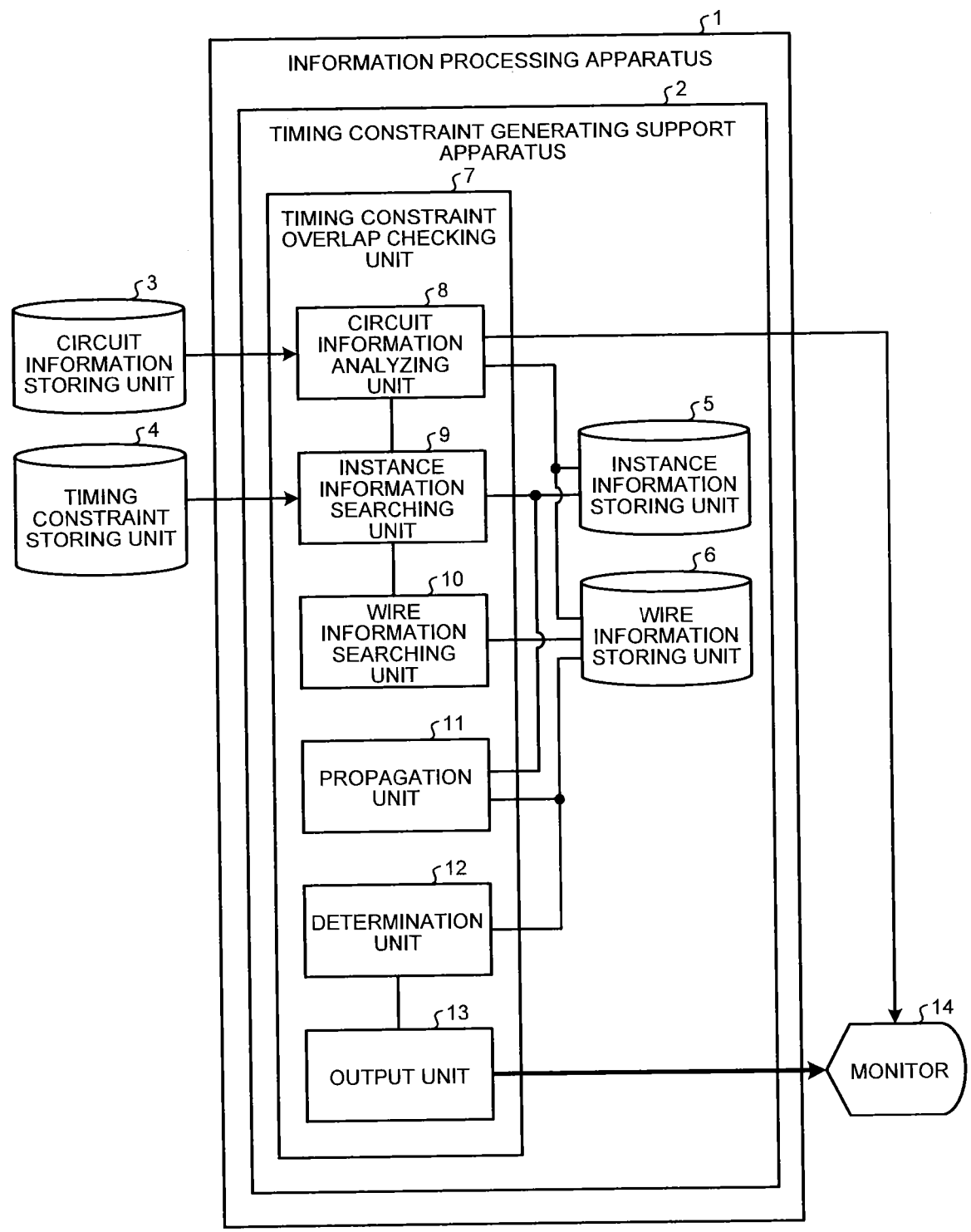
FIG. 1 is a diagram that illustrates an information processing apparatus according to First Embodiment.

In First Embodiment described below, an information processing apparatus that includes a timing constraint generating support apparatus will be described with reference to FIG. 1. Further, FIG. 1 is a diagram that illustrates the information processing apparatus according to First Embodiment. The information processing apparatus is a workstation that at least supports timing constraint generating.

As illustrated in FIG. 1, an information processing apparatus 1 includes a timing constraint generating support apparatus 2. In addition, the information processing apparatus 1 is connected to a circuit information storing unit 3, a timing constraint storing unit 4, and a monitor 14. The timing constraint generating support apparatus 2 includes an instance information storing unit 5, a wire information storing unit 6, and a timing constraint overlap checking unit 7. In addition, the timing constraint overlap checking unit 7 includes a circuit information analyzing unit 8, an instance information searching unit 9, a wire information searching unit 10, a propagation unit 11, a determination unit 12, and an output unit 13.

The circuit information storing unit 3 is a storage unit that stores circuit information. More specifically, the circuit information storing unit 3 stores the circuit information that includes a module name, an instance name, a pin name, logic information, a wire name, a driver pin name, and a receiver pin name as detailed information of a circuit. For example, the circuit information storing unit 3 stores the circuit information that is illustrated in FIG. 2 as an example. FIG. 2 is a diagram that illustrates an example of the circuit information.

The timing constraint storing unit 4 stores timing constraints. More specifically, the timing constraint storing unit 4 stores timing constraints each including a module to which a corresponding timing constraint is applied and the name of a pin to which a wire, to which the timing constraint is propagated, is connected. In an example illustrated in FIG. 3, the timing constraint storing unit 4 stores a timing constraint of "set_multicycle_path 2-setup-start-from[get_pins-DATA_IN_A*]". In addition, in the example illustrated in FIG. 3, the timing constraint storing unit 4 stores a timing constraint of "set_multicycle_path 4-setup-start-through [get_pins inst_IN_B/C*]". FIG. 3 is a diagram that illustrates an example of timing constraints.

Referring back to FIG. 1, the instance information storing unit 5 stores instance information that is information relating to a logic circuit. More specifically, the instance information storing unit 5 stores instance information that is generated by the circuit information analyzing unit 8 to be described later based on the circuit information stored in the circuit information storing unit 3. For example, the instance information storing unit 5 stores instance information in which module name "SCVOR", instance name "inst_A1", input pins "A" and "B", output pin "Y", and logic information "Y=A or B" are associated with each other. In other words, the instance information storing unit 5 stores the instance information that relates to OR circuit "inst_A1" that has input pins "A" and "B" and an output pin "Y".

The wire information storing unit 6 stores wire information that represents connection relation between logic circuits. In other words, the wire information storing unit 6 stores information that represents wires connecting logic circuits. More specifically, the wire information storing unit 6 stores the wire information that is generated by the circuit information analyzing unit 8 to be described later based on the circuit information that is stored in the circuit information storing unit 3.

For example, the wire information storing unit 6 stores wire information that associates wire name "wire_2", driver pin name "DATA_IN_A[2]", and receiver pin name "inst_B/A[2]" with each other. In addition, the wire information storing unit 6 stores the wire information with a timing constraint storing area for storing a timing constraint being added thereto. In this timing constraint storing area, a timing constraint is stored by the propagation unit 11 as will be described later.

The circuit information analyzing unit 8 analyzes the circuit information that is stored in the circuit information storing unit 3 and generates the instance information and the wire information based on the analyzed circuit information. More specifically, the circuit information analyzing unit 8 analyzes the circuit information that is stored in the circuit information storing unit 3 and acquires detailed information of a circuit that is included in the analyzed circuit information.

Then, the circuit information analyzing unit 8 stores the generated instance information in the instance information storing unit 5. In addition, the circuit information analyzing unit 8 stores the generated wire information in the wire information storing unit 6. Furthermore, the circuit information analyzing unit 8 generates a circuit diagram represented by the circuit information by using the instance information and the wire information that have been generated. Then, the circuit information analyzing unit 8 displays the generated circuit diagram on the monitor 14.

Figure 4:
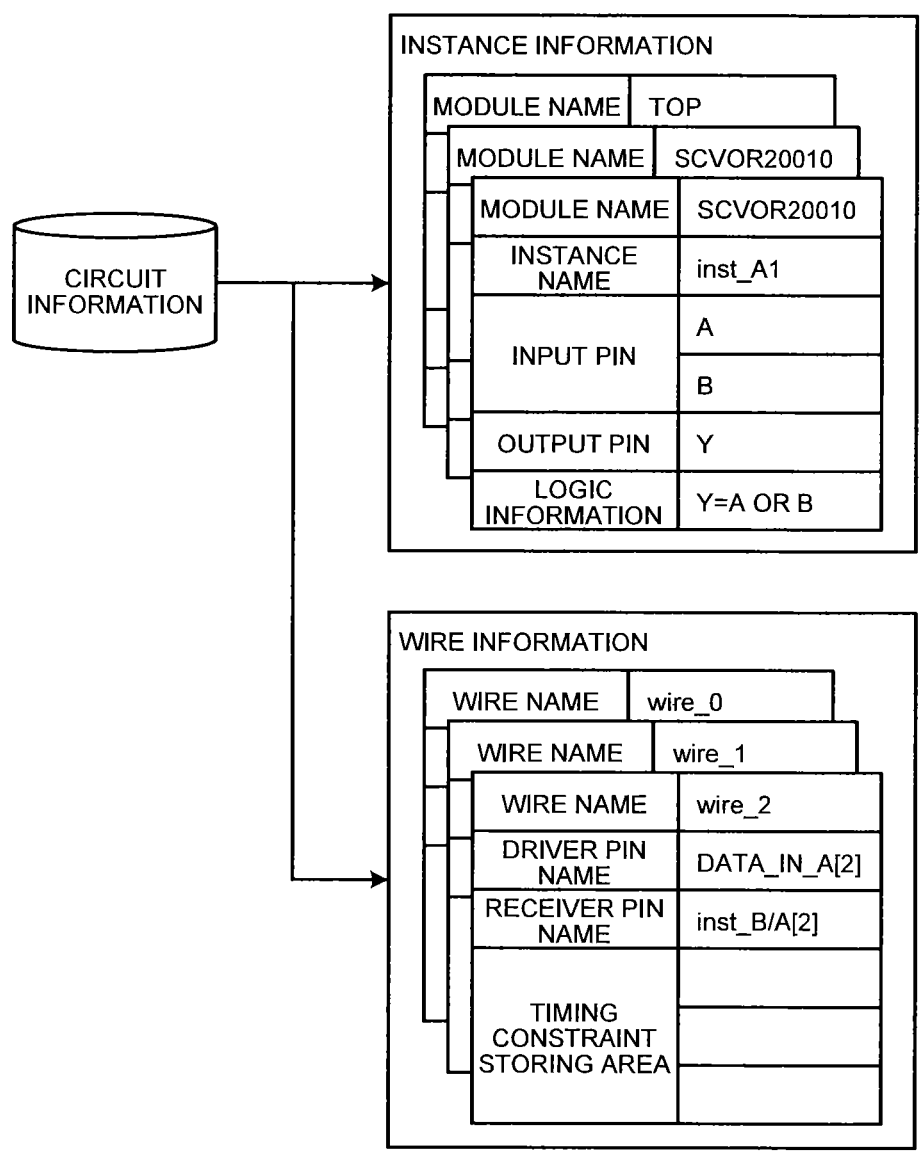
FIG. 4 is a diagram that illustrates an example of a process of generating instance information and wire information.

For example, in an example illustrated in FIG. 4, the circuit information analyzing unit 8 generates instance information in which module name "SVCOR20010", instance name "inst_A1", input pins "A" and "B", output pin "Y", and logic information "Y=A or B" are stored. Then, the circuit information analyzing unit 8 stores the generated instance information in the instance information storing unit 5.

In addition, in the example illustrated in FIG. 4, the circuit information analyzing unit 8 stores wire name "wire_2", driver pin name "DATA_IN_A[2]", and receiver pin name "inst_B/A[2]" and generates the wire information in which a timing constraint storing area is secured. Then, the circuit information analyzing unit 8 stores the generated wire information in the wire information storing unit 6.

Figure 5:
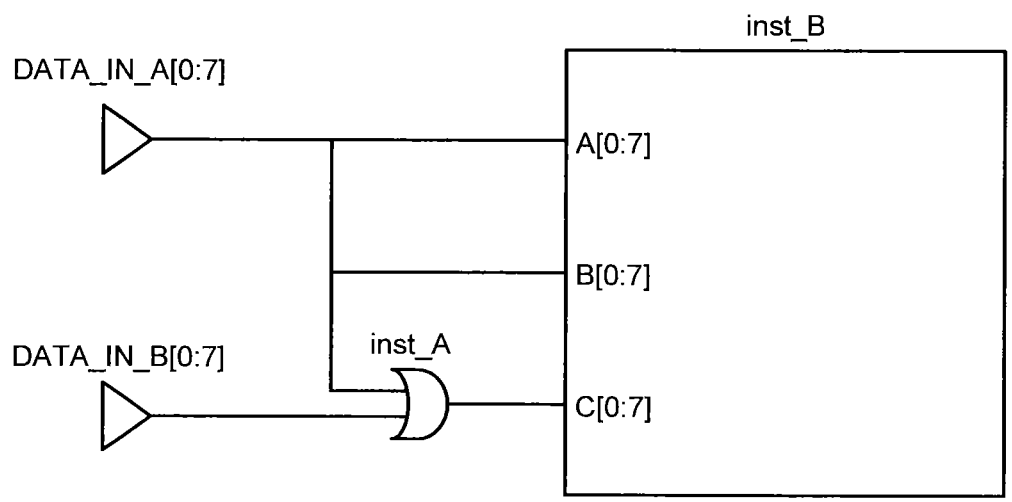
FIG. 5 is a diagram that illustrates an example of a circuit diagram that is represented by circuit information.

In an example illustrated in FIG. 5, the circuit information analyzing unit 8 generates a circuit diagram in which DATA_IN_A[0:7], DATA_IN_B[0:7], inst_A, and inst_B are connected using a plurality of wires and displays the generated circuit diagram on the monitor 14. FIG. 5 is a diagram that illustrates an example of the circuit diagram that is represented by the circuit information.

Referring back to FIG. 1, the instance information searching unit 9 acquires a timing constraint and searches the instance information storing unit 5 for instance information that represents a logic circuit in which the timing constraint is set. More specifically, the instance information searching unit 9 acquires a timing constraint that is stored in the timing constraint storing unit 4.

Then, the instance information searching unit 9 analyzes the acquired timing constraint and acquires instance information that is included in the timing constraint. Then, the instance information searching unit 9 analyzes the acquired instance information and acquires pin names included in the instance information. Thereafter, the instance information searching unit 9 notifies the wire information searching unit 10 of the pin names and the timing constraint that have been acquired.

For example, the instance information searching unit 9 acquires a timing constraint of "set_multicycle_path 2-setup-start-from[get_pinsDATA_IN_A*]". In such a case, the instance information searching unit 9 analyzes the acquired timing constraint and determines an instance name "TOP" based on "get_pinsDATA_IN_A*" that is included in the timing constraint. In addition, the instance information searching unit 9 determines a pin name "DATA_IN_A*" based on "get_pinsDATA_IN_A*" that is included in the timing constraint. Here, "*" is a symbol that represents an arbitrary character or an arbitrary number.

Then, the instance information searching unit 9 searches for instance information in which an instance name of "TOP" is stored from among instance information that is stored in the instance information storing unit 5 using the determined instance name "TOP". In addition, the instance information searching unit 9 acquires a pin name "DATA_IN_A[2]" that matches "DATA_IN_A*" from the output name that is stored in the instance information of which the instance name is "TOP".

Then, the instance information searching unit 9 notifies the wire information searching unit 10 of the acquired output pin name "DATA_IN_A[2]". In addition, the instance information searching unit 9 notifies the wire information searching unit 10 of the acquired timing constraint "set_multicycle_path 2-setup-start-from[get_pinsDATA_IN_A*]".

The wire information searching unit 10 searches for the wire information that represents a wire connected to the logic circuit in which the timing constraint is set. In other words, the wire information searching unit 10 searches for wire information that represents connection relation of the logic circuit in which the timing constraint is set. More specifically, the wire information searching unit 10 acquires an output pin name and a timing constraint from the instance information searching unit 9. Then, the wire information searching unit 10 searches for wire information in which the acquired output pin name is stored as a driver pin name. Thereafter, the wire information searching unit 10 stores a timing constraint that is acquired in the timing constraint storing area of the retrieved wire information.

Figure 6:
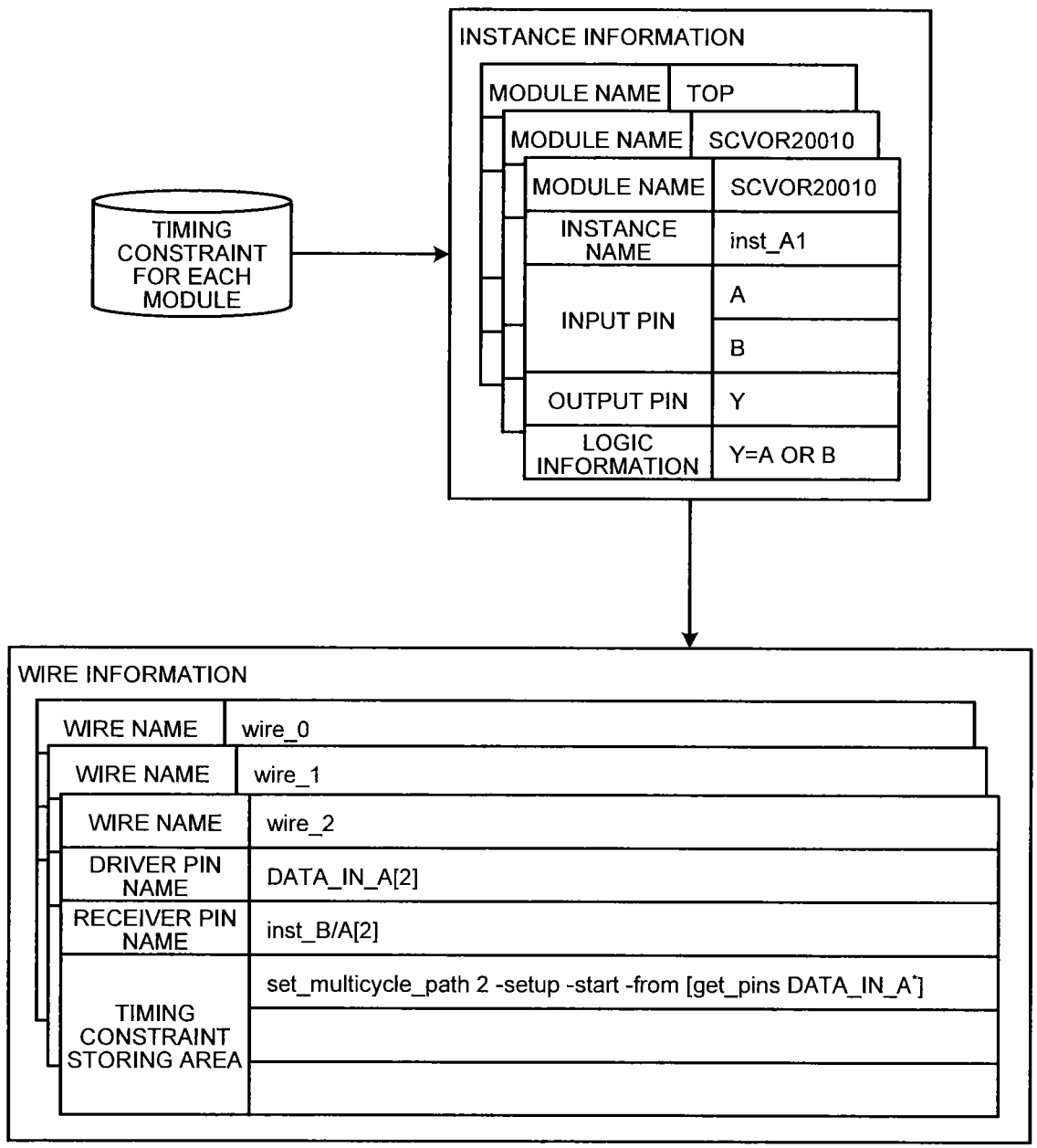
FIG. 6 is a diagram that illustrates addition of a timing constraint.

Here, an example of the process that is performed by the wire information searching unit 10 will be described with reference to FIG. 6. FIG. 6 is a diagram that illustrates addition of a timing constraint. For example, the wire information searching unit 10 acquires a pin name "DATA_IN_A[2]" from the instance information searching unit 9. In addition, the wire information searching unit 10 acquires a timing constraint "set_multicycle_path 2-setup-start-from[get_pinsDATA_IN_A*]" from the instance information searching unit 9. Then, the wire information searching unit 10 searches for wire information in which the acquired pin name "DATA_IN_A[2]" is stored as a driver pin name from among the wire information storing unit 6.

In the example illustrated in FIG. 6, the wire information searching unit 10 specifies wire information in which a wire name of "wire2" is stored as the wire information in which the pin name of "DATA_IN_A[2]" is stored as a driver pin name. Then, the wire information searching unit 10 stores the timing constraint of "set_multicycle_path 2-setup-start-from[get_pinsDATA_IN_A*]" in the timing constraint storing area of the specified wire information.

Referring back to FIG. 1, the propagation unit 11 propagates the timing constraint set for each logic circuit through a wire by using the instance information and the wire information and using a condition that indicates whether or not the timing constraint is to be propagated through the wire. More specifically, the propagation unit 11 searches for wire information in which a timing constraint is stored in the timing constraint storing area and acquires a receiver pin name and the stored timing constraint of the retrieved wire information. In addition, the propagation unit 11 searches for instance information that represents a logic circuit to which the timing constraint is propagated by using the acquired receiver pin name. In other words, the propagation unit 11 searches for instance information that represents a logic circuit that is a connection destination of the wire represented by the wire information.

Then, the propagation unit 11 determines whether or not the retrieved instance information satisfies a propagation condition. Here, the propagation condition is a condition that is used for determining whether or not the logic circuit represented by the instance information propagates a timing constraint to another logic circuit. For example, as types of logic circuits, there are an "OR circuit", an "AND circuit", a "NOT circuit", a "SELECT circuit", a flip flop, a null, and the like. Each of these various types of logic circuits outputs input information to another logic circuit in accordance with a condition that is different for each type of the circuit. In other words, a method of propagating a timing constraint is different for each logic circuit. Here, null represents that an instance is a top hierarchy.

Accordingly, the propagation unit 11 determines whether or not the timing constraint is propagated to another logic circuit by using the instance information and the wire information and using the propagation condition. Therefore, the propagation unit 11 can accurately propagate the timing constraint.

In addition, in a case where the retrieved instance information is determined to satisfy the propagation condition, the propagation unit 11 acquires an instance name and an output pin name from the retrieved instance information. Then, the propagation unit 11 searches for wire information in which the instance name and the output pin name as a driver pin name, which have been acquired, are stored from the wire information storing unit 6.

Furthermore, the propagation unit 11 stores the timing constraint to be propagated in the timing constraint storing area of the retrieved wire information. In other words, the propagation unit 11 stores the timing constraint that is acquired first in the timing constraint storing area of the retrieved wire information. In addition, in a case where the timing constraint is stored in the wire information, the propagation unit 11, as described above, searches for instance information again.

As above, the propagation unit 11 propagates the timing constraint while tracing the wire information and the instance information with instance information that represents a logic circuit to which the timing constraint is applied set as a starting point. In addition, the propagation unit 11 stores the timing constraint in the wire information that represents a wire used for connecting logic circuits to which the timing constraint is propagated.

Figure 7:
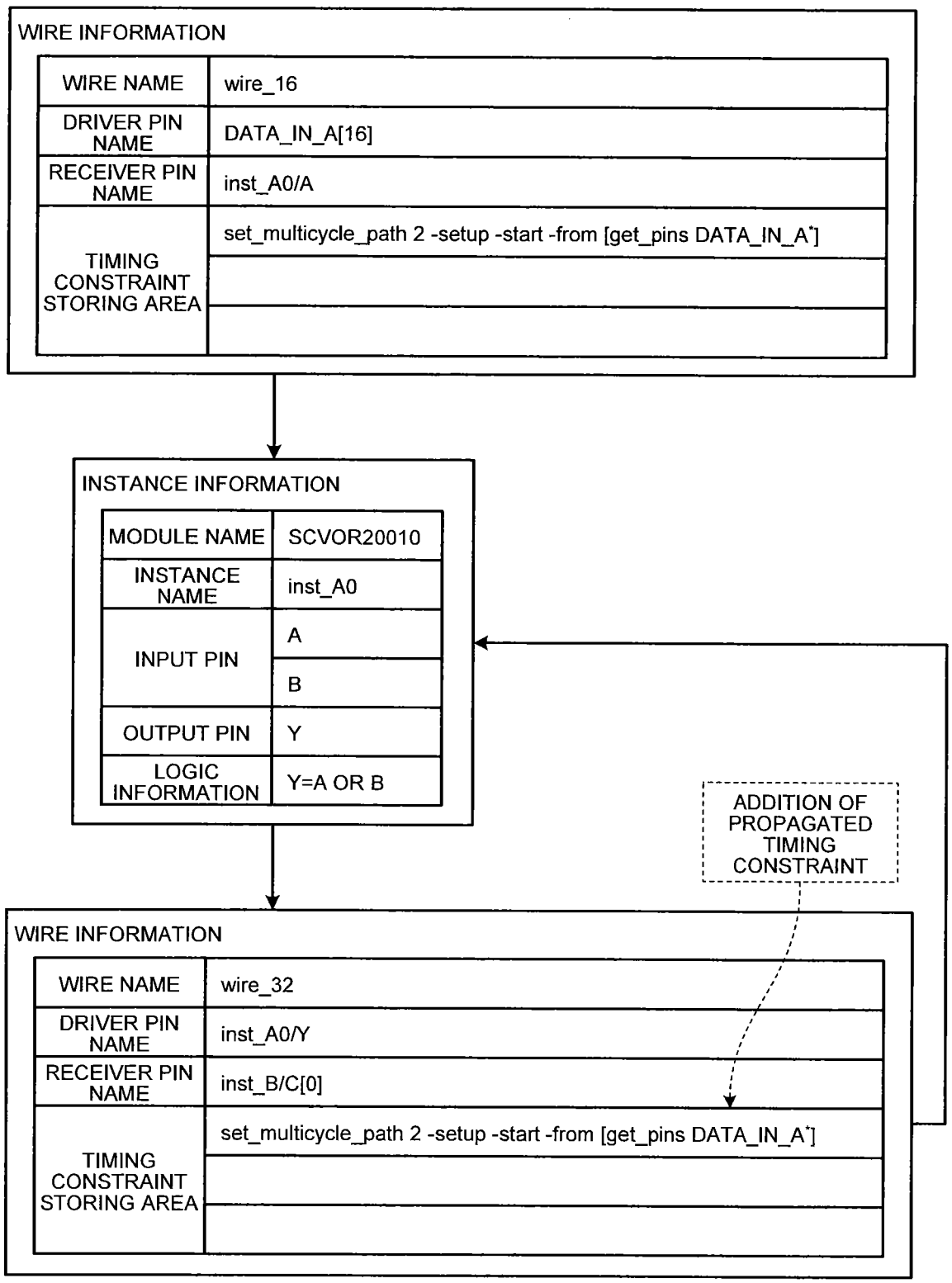
FIG. 7 is a diagram that illustrates an example of the propagation of a timing constraint.

Hereinafter, a specific example of the process that is performed by the propagation unit 11 will be described with reference to FIGS. 7 and 8. Further, FIG. 7 is a diagram that illustrates an example of the propagation of a timing constraint. In addition, FIG. 8 is a diagram that illustrates an example of propagation conditions of a timing constraint. In the example illustrated in FIG. 7, it is assumed that the propagation unit 11 specifies wire information in which "wire_16" is stored in the wire name as a result of searching for the wire information in which the timing constraint is stored in the timing constraint storing area from the wire information storing unit 6.

In such a case, the propagation unit 11 acquires a receiver pin name of "inst_A0/A" that is stored in the wire information of the wire name "wire_16". In addition, the propagation unit 11 acquires a timing constraint of "set_multicycle_path 2-setup-start-from[get_pinsDATA_IN_A*]" that is stored in the wire information of the wire name "wire_16".

In addition, the propagation unit 11 searches for instance information in which "inst_A0" is stored in the instance name from the instance information storing unit 5 by using the acquired receiver pin name "inst_A0/A". Then, in a case where the instance information in which "inst_A0" is stored in the instance name is specified, the propagation unit 11 acquires information "Y" that is stored in the output pin of the specified instance information.

Furthermore, the propagation unit 11 determines that "or" is included in the logic information of the instance information in which "inst_A0" is stored in the instance name. In other words, the propagation unit 11 determines that the logic circuit of the instance name "inst_A0" is an OR circuit. Then, the propagation unit 11 determines whether or not the logic circuit represented by the specified instance information propagates the timing constraint by using a propagation condition illustrated in FIG. 8 as an example.

Here, FIG. 8 is a diagram that illustrates an example of propagation conditions of a timing constraint. In the example illustrated in FIG. 8, in a case where the type of the logic circuit as the propagation condition is "or", it is determined whether or not the acquired timing constraint is "0 fixation". In a case where the timing constraint is determined not to be "0 fixation", conditions for propagating the timing constraint is illustrated in the example.

Furthermore, in the example illustrated in FIG. 8, in a case where the timing constraint acquired as the propagation condition is determined to be "0 fixation", a search for wire information of each wire that is connected to a pin other than the input pin used for the search of the instance information is performed. Then, conditions for propagating the timing constraint are illustrated in a case where another timing constraint stored in the retrieved wire information is "0 fixation".

In the example illustrated in FIG. 7, the timing constraint used for determining whether to propagate the timing constraint is not "0 fixation". Accordingly, the propagation unit 11 determines that the timing constraint is propagated through a logic circuit that is represented by the instance information in which an instance name of "inst_A0" is stored. Then, the propagation unit 11 searches for wire information by using the instance name of "inst_A0" and an output pin of "Y".

Accordingly, the propagation unit 11 specifies the wire information in which "wire_32" is stored in the wire name. Therefore, the propagation unit 11 adds the propagated timing constraint to the timing constraint storing area of the specified wire information. Thereafter, the propagation unit 11 performs the same process as the above-described process and searches for instance information that represents a logic circuit to which the timing constraint is propagated.

As above, the propagation unit 11 can specify the logic circuit to which the timing constraint is propagated and a path through which information is transmitted and received in accordance with the timing constraint by adding the propagated timing constraint to the timing constraint storing area of the wire information.

Referring back to FIG. 1, the determination unit 12 determines whether a plurality of timing constraints different from each other are propagated through the wire by the propagation unit 11. In addition, in a case where a plurality of timing constraints of the same type are propagated through the wire by the propagation unit 11, and values set by the propagated timing constraints are different from each other, the determination unit 12 determines that a plurality of timing constraints different from each other are propagated through the wire.

More specifically, in a case where all the timing constraints have been propagated to logic circuits different from each other by the propagation unit 11, the determination unit 12 searches for wire information in which a plurality of timing constraints different from each other are stored out of wire information stored in the wire information storing unit 6. Then, the determination unit 12 determines whether or not the timing constraints stored in the timing constraint storing area of the retrieved wire information overlap each other.

Thereafter, in a case where it is determined that the timing constraints stored in the timing constraint storing area of the wire information overlap each other, the determination unit 12 registers wire information of which timing constraints overlap each other as an overlapping wire information group. In other words, the determination unit 12 searches for wire information that represents wires included in a range to which a plurality of timing constraints different from each other are applied and registers the retrieved wire information as an overlapping wire information group.

Here, the overlapping of timing constraints represents a state in which the set types represented by the timing constraints are the same, and set values represented by the timing constraints are different from each other. For example, in a case where two timing constraints that designate multi-cycles and designate set values different from each other are stored in the timing constraint storing area of wire information, the determination unit 12 determines that the timing constraints overlap each other.

Figure 9:
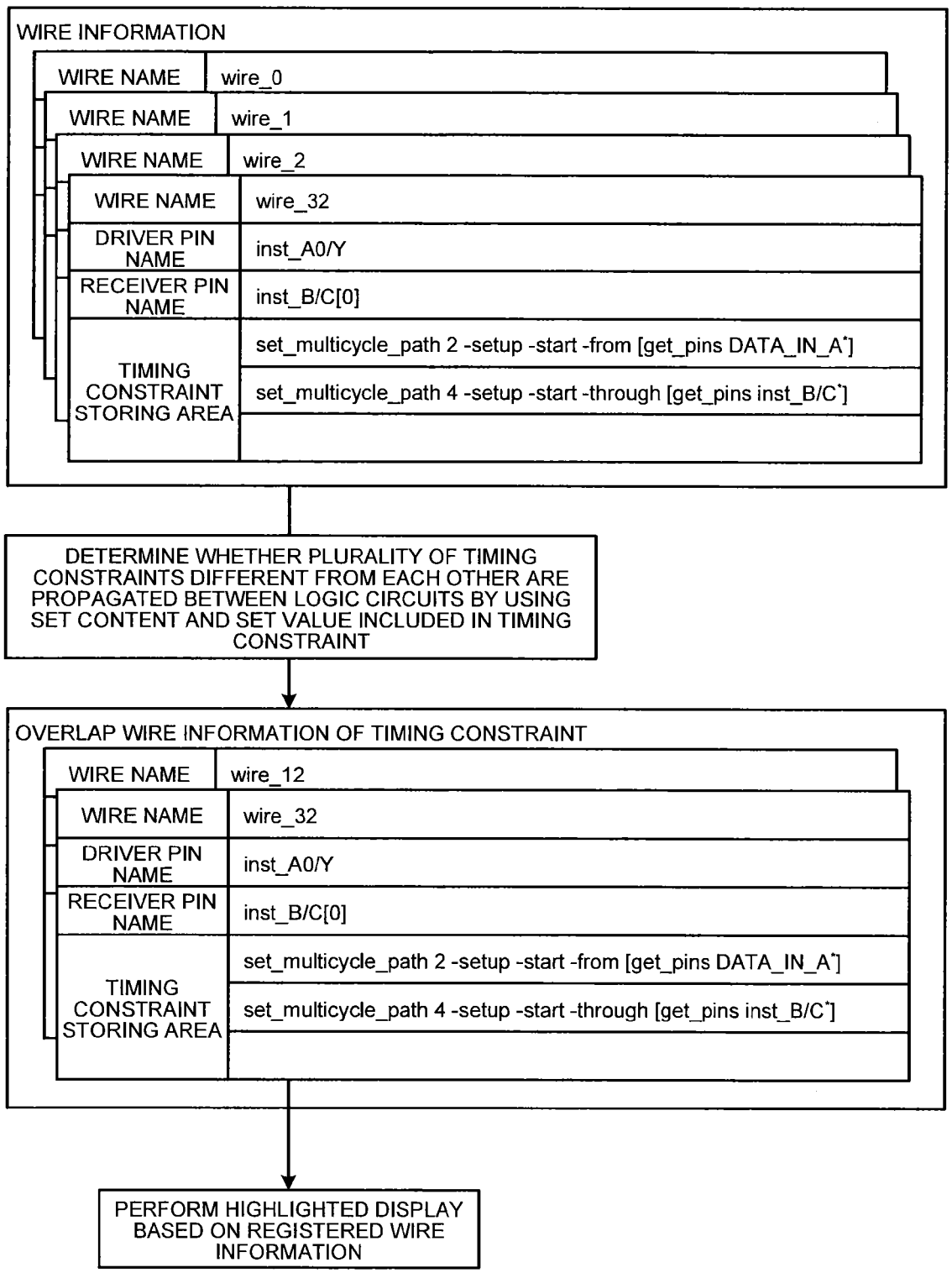
FIG. 9 is a diagram that illustrates an example of an overlap of timing constraints.

Here, a specific example of the process that is performed by the determination unit 12 will be described with reference to FIG. 9. FIG. 9 is a diagram that illustrates an example of an overlap of timing constraints. In the example illustrated in FIG. 9, the determination unit 12 determines that a plurality of timing constraints different from each other are stored in the timing constraint storing area of wire information in which "wire_32" is stored in the wire name. Accordingly, the determination unit 12 determines whether or not the timing constraints stored in the timing constraint storing area overlap each other.

Here, in the example illustrated in FIG. 9, in the wire information in which "wire_32" is stored in the wire name, a timing constraint of "set_multicycle_path2-setup-start-from [get_pins DATA_IN_A*]" is stored. In other words, a timing constraint is stored therein, in which the multi-cycle is set to "2". In addition, in the wire information in which "wire_32" is stored in the wire name, a timing constraint of "set_multicycle_path4-setup-start-through[get_pins inst_B/C*]" is stored. In other words, a timing constraint is stored therein, in which the multi-cycles are set to "4".

Accordingly, the determination unit 12 determines that timing constraints of the same type that designate set values different from each other are stored in the wire information in which "wire_32" is stored in the wire name. Therefore, the determination unit 12 determines that the timing constraints overlap each other in a wire represented by the wire information in which "wire_32" is stored in the wire name. Then, the determination unit 12 registers the wire information in which "wire_32" is stored in the wire name as an overlapping wire information group. Thereafter, in a case where the overlapping of timing constraints is determined for all the pieces of the wire information stored in the wire information storing unit 6, the determination unit 12 transmits each piece of the wire information registered as the overlapping wire information group to the output unit 13.

As above, the determination unit 12 determines whether or not a plurality of timing constraints different from each other are propagated between logic circuits by using set contents and set values that are included in the timing constraints. Here, even in a case where a plurality of timing constraints different from each other are propagated, when the timing constraints are completely the same, an overlap of the timing constraints does not occur. On the other hand, even in a case where the set contents included in the timing constraints are the same, when set values are different from each other, an overlap of the timing constraints occurs.

Accordingly, the determination unit 12 compares the set contents and the set values included in the timing constraints with each other. As a result, since the determination unit 12 can appropriately determine whether or not timing constraints overlap each other, an error in the timing constraints can be appropriately detected.

Referring back to FIG. 1, in a case where a plurality of different timing constraints are determined to be propagated through the wire by the determination unit 12, the output unit 13 outputs information that represents that the timing constraints propagated through the wire overlap each other. For example, in a case where a plurality of different timing constraints are determined to be propagated through the wire by the determination unit 12, the output unit 13 outputs a circuit diagram in which a wire portion, to which the plurality of timing constraints different from each other are propagated, is highlighted.

Figure 10:
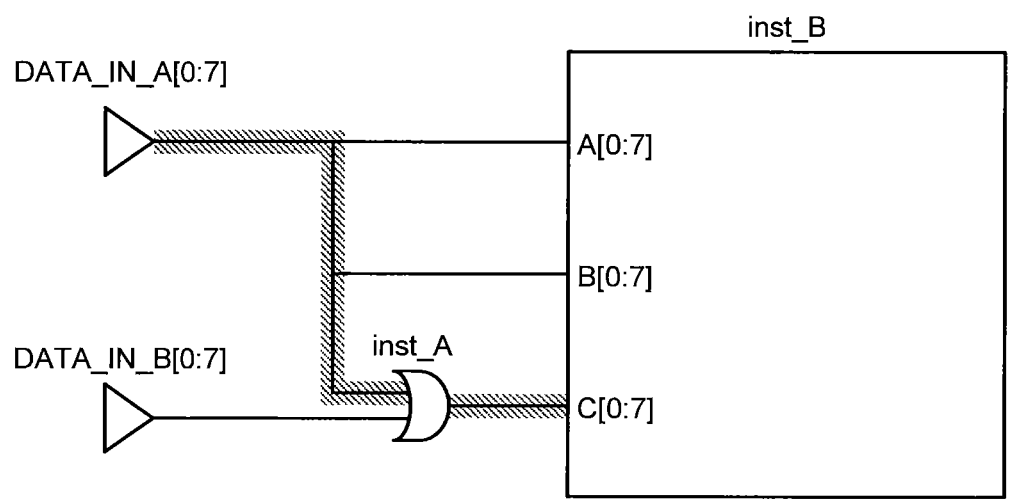
FIG. 10 is a diagram that illustrates an example of a circuit diagram that is output.

More specifically, the output unit 13 receives each piece of the wire information that is registered as an overlapping wire information group from the determination unit 12. Then, the output unit 13 displays a wire portion represented by each piece of the wire information that is received from the determination unit 12 on the monitor 14. For example, as illustrated in a hatched portion in FIG. 10, the output unit 13 displays a circuit diagram in which a range, in which the timing constraints overlap each other, in other words, a range in which there is an error in the timing constraints is highlighted, on the monitor 14. FIG. 10 is a diagram that illustrates an example of the circuit diagram that is output.

For example, the timing constraint generating support apparatus 2 is an electronic circuit. In addition, the circuit information analyzing unit 8, the instance information searching unit 9, the wire information searching unit 10, the propagation unit 11, the determination unit 12, and the output unit 13 are electronic circuits. Here, as examples of the electronic circuits, integrated circuits such as an application specific integrated circuit (ASIC) and a field programmable gate array (FPGA) or central processing units (CPU) and micro processing units (MPU) are used.

The circuit information storing unit 3, the timing constraint storing unit 4, the instance information storing unit 5, and the wire information storing unit 6 are semiconductor memory devices such as random access memory (RAM), read only memory (ROM), and flash memory or storage devices such as a hard disk and an optical disc.

Figure 11:
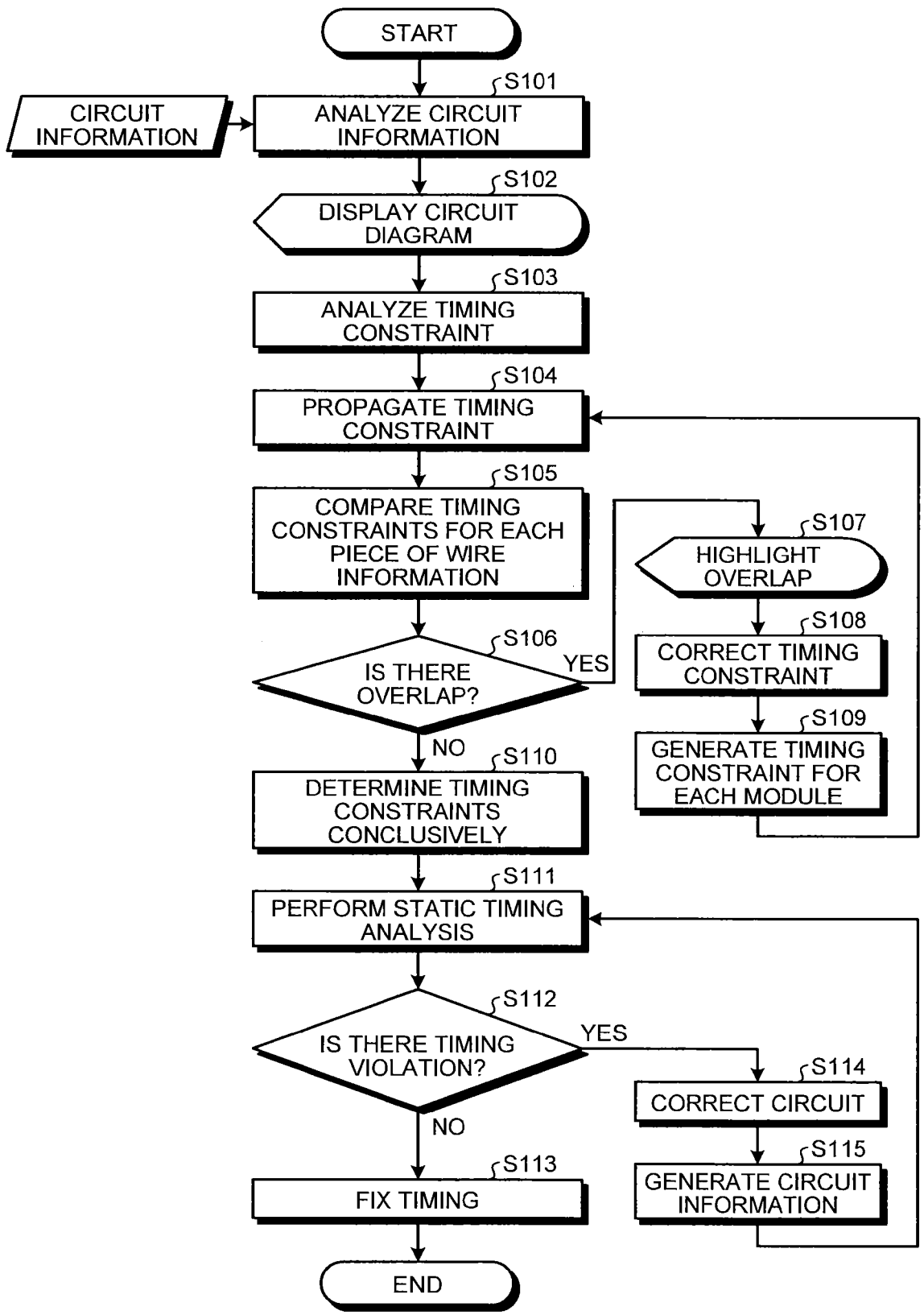
FIG. 11 is a flowchart that illustrates an example of the process that is performed by a timing constraint generating support apparatus according to First Embodiment.

Next, the flow of the process that is performed by the timing constraint generating support apparatus 2 will be described with reference to FIG. 11. FIG. 11 is a flowchart that illustrates an example of the process that is performed by the timing constraint generating support apparatus according to First Embodiment.

First, the timing constraint generating support apparatus 2 acquires circuit information and analyzes the circuit information based on the acquired circuit information in Step S101. At this time, the timing constraint generating support apparatus 2 generates instance information and wire information based on the acquired circuit information and stores the instance information and the wire information. In addition, the timing constraint generating support apparatus 2 generates a circuit diagram based on the acquired circuit information and displays the generated circuit diagram on the monitor 14 in Step S102.

In addition, the timing constraint generating support apparatus 2 acquires a timing constraint and analyzes the acquired timing constraint in Step S103. At this time, the timing constraint generating support apparatus 2 searches for wire information from the instance information in which the acquired timing constraint is set and stores the timing constraint in the retrieved wire information.

Then, the timing constraint generating support apparatus 2 propagates the timing constraint from the wire information in which the timing constraint is stored in Step S104. In other words, the timing constraint generating support apparatus 2 determines wire information of each wire that connects logic circuits to which the timing constraint is propagated by tracing the instance information and the wire information. Then, the timing constraint generating support apparatus 2 stores the propagated timing constraint in the determined wire information.

Next, the timing constraint generating support apparatus 2 compares the timing constraints with the information of each wire in Step S105. Then, the timing constraint generating support apparatus 2 determines whether or not timing constraints stored in the wire information overlap each other in Step S106. In a case where the timing constraints stored in the wire information are determined to overlap each other (Yes in Step S106), the timing constraint generating support apparatus 2 displays the overlap on the monitor 14 with being highlighted in Step S107.

Thereafter, the timing constraints are corrected by a developer in Step S108, and the timing constraints for each module are generated by the developer again in Step S109. Thereafter, the timing constraint generating support apparatus 2 propagates the timing constraints again by using the timing constraints which have been generated again and have been corrected.

On the other hand, in a case where the timing constraints stored in the wire information are determined not to overlap each other (No in Step S106), the timing constraint generating support apparatus 2 determines the timing constraints conclusively in Step S110. Thereafter, a static timing analysis is performed in Step S111, and it is determined whether or not a timing violation occurs in Step S112. Here, in a case where it is determined that the timing violation does not occur (No in Step S112), the timing of the circuit is fixed in Step S113.

On the other hand, in a case where it is determined that a timing violation has occurred (Yes in Step S112), the circuit is corrected by the developer in Step S114 and corrected circuit information is generated in Step S115. Thereafter, a static timing analysis using the corrected circuit information is performed again in Step S111.

In other words, the timing constraint generating support apparatus 2 detects an error in the timing constraints by using the instance information and the wire information before performing the static timing analysis. Accordingly, since the static timing analysis using timing constraints having no error is performed, in a case where it is determined that there is a timing violation, it can be determined that the cause of the timing violation is an error in the circuit design. Accordingly, the timing constraint generating support apparatus 2 can decrease the number of man-hours taken for determining the cause of a timing violation.

Figure 12:
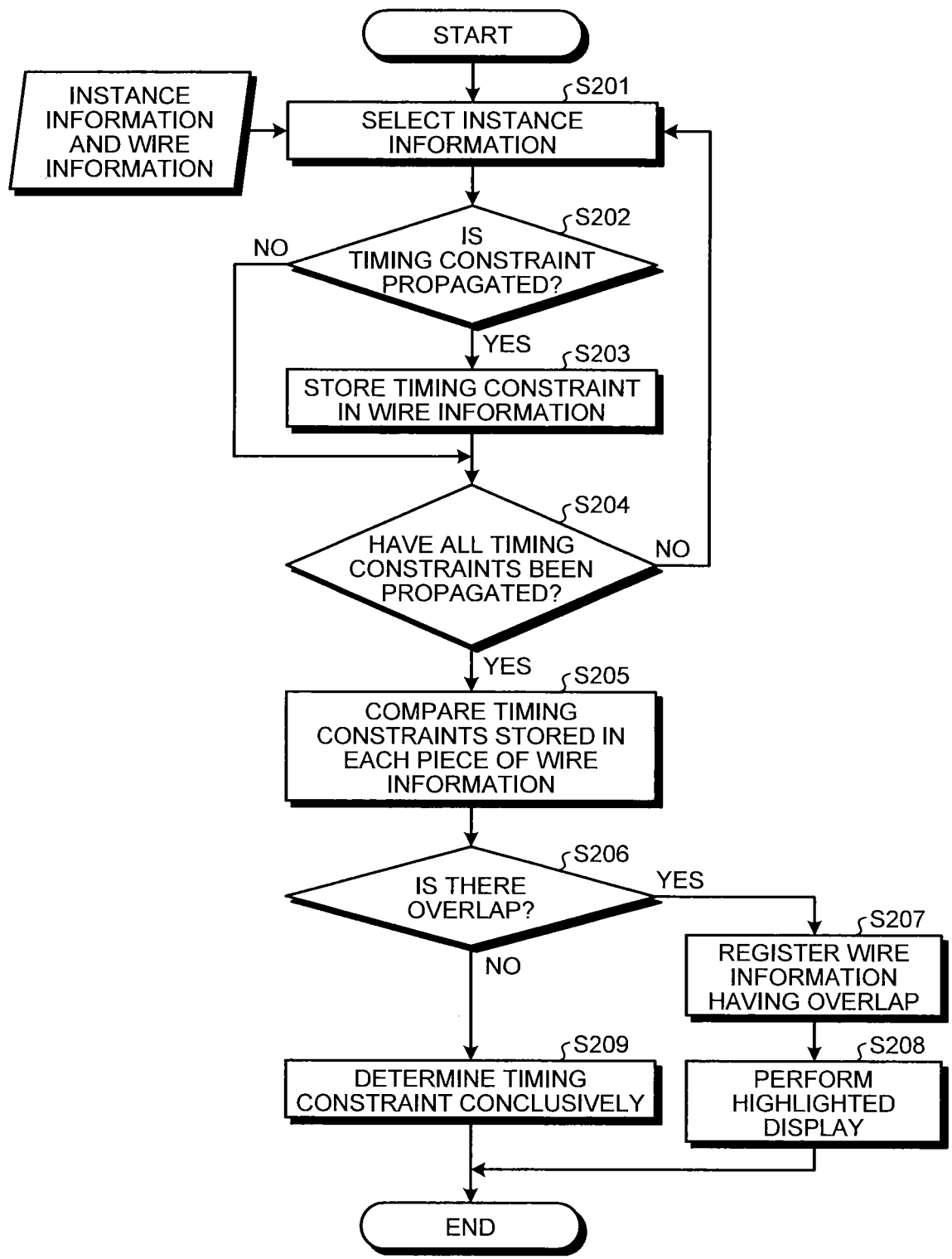
FIG. 12 is a flowchart that illustrates examples of a propagation process and a comparison process of timing constraints.

Next, a process will be described in detail with reference to FIG. 12 in which the timing constraint generating support apparatus 2 propagates timing constraints, compares the timing constraints with each other, and determines whether or not there is an overlap of the timing constraints. The processes that are performed in Steps S201 to S209 illustrated in FIG. 12 correspond to the processes described in Steps S104 to S107 and S110 illustrated in FIG. 11. FIG. 12 is a flowchart that illustrates examples of a propagation process and a comparison process of timing constraints.

First, the timing constraint generating support apparatus 2 searches for instance information by using a receiver pin name that is stored in the wire information in Step S201. In other words, the timing constraint generating support apparatus 2 searches for instance information that represents a logic circuit to which the timing constraint is propagated. Next, the timing constraint generating support apparatus 2 determines whether or not a range in which the timing constraint is applied is propagated, in accordance with the logic information of the retrieved instance information and propagation condition information in Step S202.

Here, in a case where the timing constraint is determined not to be propagated (No in Step S202), the timing constraint generating support apparatus 2 determines whether or not all the timing constraints set for each logic circuit have been propagated in Step S204. On the other hand, in a case where the timing constraint is determined to be propagated (Yes in Step S202), the timing constraint generating support apparatus 2 searches for wire information by using information of an output pin that is stored in the instance information. In other words, the timing constraint generating support apparatus 2 searches for wire information that represents connection relation between a logic circuit represented by the instance information and a logic circuit to which the timing constraint is propagated. Then, the timing constraint generating support apparatus 2 stores the timing constraint in the retrieved wire information in Step S203.

Thereafter, the timing constraint generating support apparatus 2 determines whether or not all the timing constraints set for each logic circuit have been propagated in Step S204. In a case where not all the timing constraints have been propagated (No in Step S204), the timing constraint generating support apparatus 2 performs the process of Step S201 on timing constraints that have not been propagated.

On the other hand, in a case where all the timing constraints are determined to have been propagated (Yes in Step S204), the timing constraint generating support apparatus 2 compares timing constraints stored in the wire information for each piece of the wire information in Step S205. Then, the timing constraint generating support apparatus 2 determines whether or not the timing constraints stored in the wire information overlap each other, for each piece of the wire information in Step S206.

Thereafter, in a case where the timing constraints are determined to overlap each other (Yes in Step S206), the timing constraint generating support apparatus 2 registers the wire information in which it is determined that the timing constraints overlap each other in an overlapping wire information group in Step S207. Thereafter, the timing constraint generating support apparatus 2 outputs a circuit diagram in which a wire portion represented by the wire information registered in the overlapping wire information group is highlighted, from the monitor 14 in Step S208. Thereafter, the timing constraint generating support apparatus 2 ends the process.

On the other hand, in a case where the timing constraints are determined not to overlap each other (No in Step S206), the timing constraint generating support apparatus 2 determines the timing constraints conclusively in Step S209. Thereafter, the timing constraint generating support apparatus 2 ends the process.

Effects of First Embodiment

As described above, the timing constraint generating support apparatus 2 according to First Embodiment propagates the timing constraints set for each logic circuit to another logic circuit by using the instance information and the wire information. Then, the timing constraint generating support apparatus 2 determines whether or not a plurality of timing constraints different from each other have been propagated by using the same connection information.

Here, in a case where one wire is included in an application range to which a plurality of timing constraints that overlap each other are applied, there is an error in the timing constraints. Accordingly, by determining whether or not a plurality of timing constraints different from each other have been propagated by using the same connection information, the timing constraint generating support apparatus 2 can determine whether or not there is an error in the timing constraints. In other words, in a case where a timing violation occurs when the static timing analysis is performed, the timing constraint generating support apparatus 2 can limit the cause of the timing violation to an error in the design of the circuit. Accordingly, the number of man-hours taken for determining whether or not the cause of the timing violation is an error in the timing constraints can be decreased.

In addition, the timing constraint generating support apparatus 2 determines whether or not a plurality of timing constraints of which the determination types are the same and the set values are different from each other have been propagated by using the same connection information. Accordingly, the timing constraint generating support apparatus 2 can accurately determine an error in the timing constraints.

In addition, the timing constraint generating support apparatus 2 propagates the timing constraints using propagation conditions representing conditions for the timing constraints to be propagated to other logic circuits for each type of logic circuits in addition to using the instance information and the wire information. Accordingly, the timing constraint generating support apparatus 2 can accurately specify the logic circuit to which each timing constraint is propagated.

Furthermore, in a case where a plurality of timing constraints different from each other are determined to have been propagated using the same connection information, the timing constraint generating support apparatus 2 outputs information representing that the timing constraints overlap each other. Therefore, according to the timing constraint generating support apparatus 2, an operation of correcting an error in the timing constraints can be easily performed by the developer.

[b] Second Embodiment

While the embodiment of the present invention has been described until now, the present invention may be performed in various forms other than the above-described embodiment. Thus, hereinafter, as Second Embodiment, another embodiment belonging to the present invention will be described.

(1) Propagation of Timing Constraint and Overlap of Timing Constraints

In order to propagate the timing constraints, the above-described timing constraint generating support apparatus 2 stores the timing constraints in the wire information that represents connection relation between logic circuits to which the timing constraints are propagated by tracing the wire information and the instance information. However, the embodiment is not limited thereto, but any arbitrary method may be used as long as the timing constraints are propagated using the instance information and the wire information, and a path through which the timing constraints are propagated can be identified.

(2) Each Unit of Timing Constraint Overlap Checking Unit 7

The above-described timing constraint overlap checking unit 7 includes the circuit information analyzing unit 8, the instance information searching unit 9, the wire information searching unit 10, the propagation unit 11, the determination unit 12, and the output unit 13. However, the embodiment is not limited thereto, but, for example, the propagation unit 11 may be configured to include the functions of the units 8 to 11. In addition, the output unit 13 is not provided, and a user may be notified of an error in the timing constraints using an arbitrary method.

In addition, in a case where the instance information and the wire information are stored in the instance information storing unit 5 and the wire information storing unit 6 in advance, the circuit information analyzing unit 8 does not need to generate the instance information and the wire information based on the circuit information. Furthermore, the circuit information analyzing unit 8 does not need to initially display the circuit diagram.

In a case where a plurality of timing constraints different from each other are determined to have been propagated through the wire by the determination unit 12, the output unit 13 outputs the wire information that represents a wire through which the plurality of timing constraints different from each other have been determined to have been propagated. However, the embodiment is not limited thereto, but, for example, the output unit 13 may output a plurality of pieces of information of timing, which are different from each other, at which the timing constraints have been propagated through one wire. The reason for this is that the output unit 13 can represent an error in the timing constraints to the developer regardless of outputting the error.

(3) Program

Figure 13:
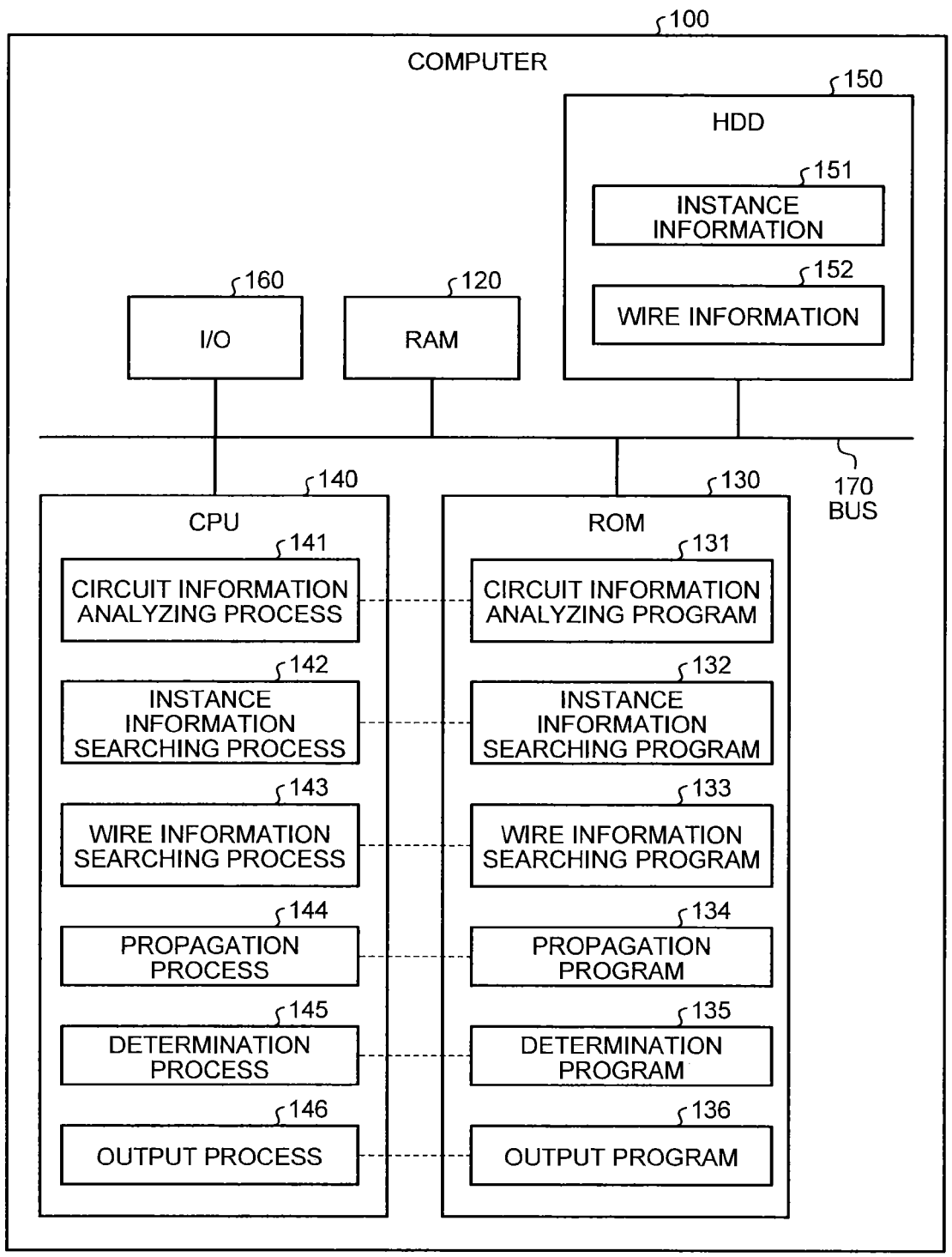
FIG. 13 is a diagram that illustrates an example of a computer that executes a timing constraint generating support program.
Figure 14:
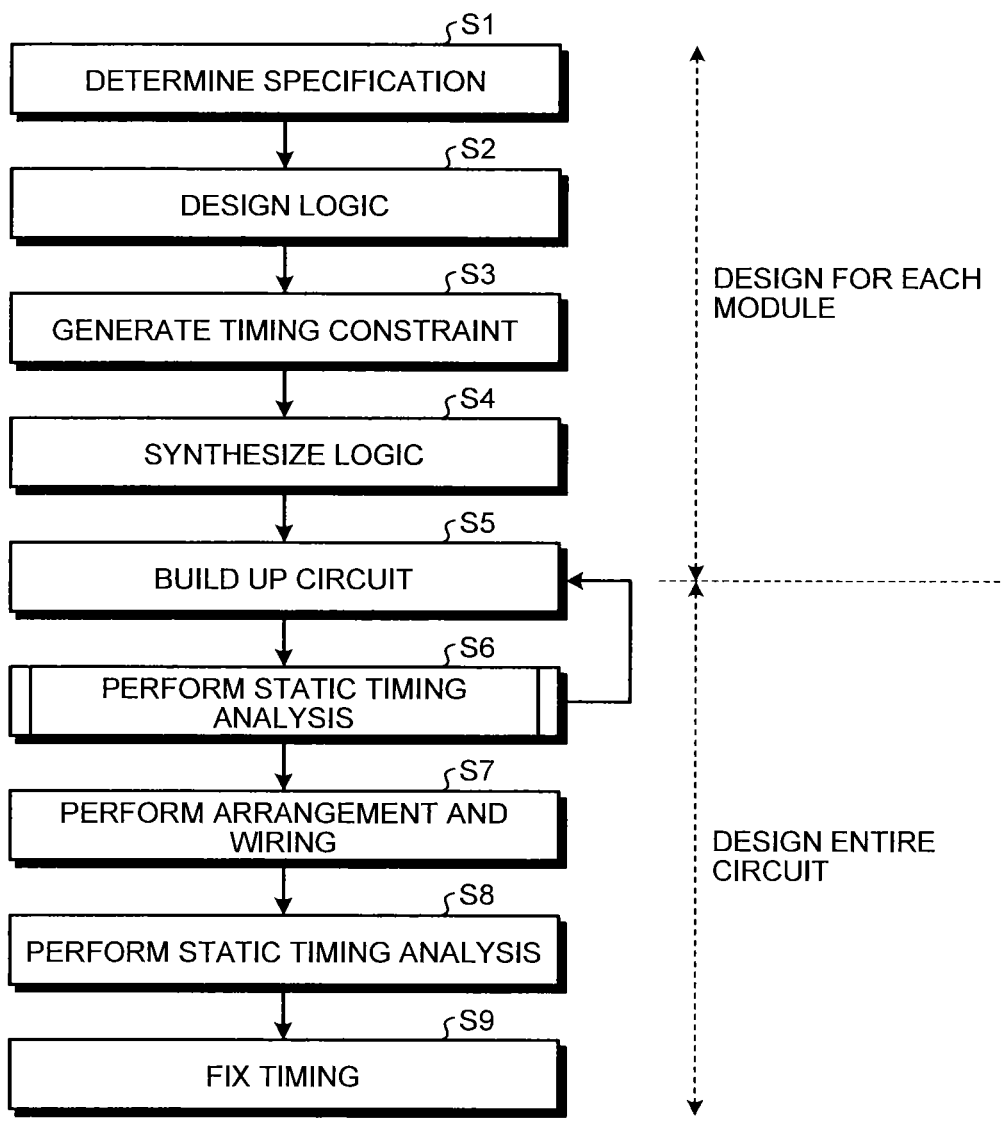
FIG. 14 is a flowchart that illustrates an example of layout process.
Figure 15:
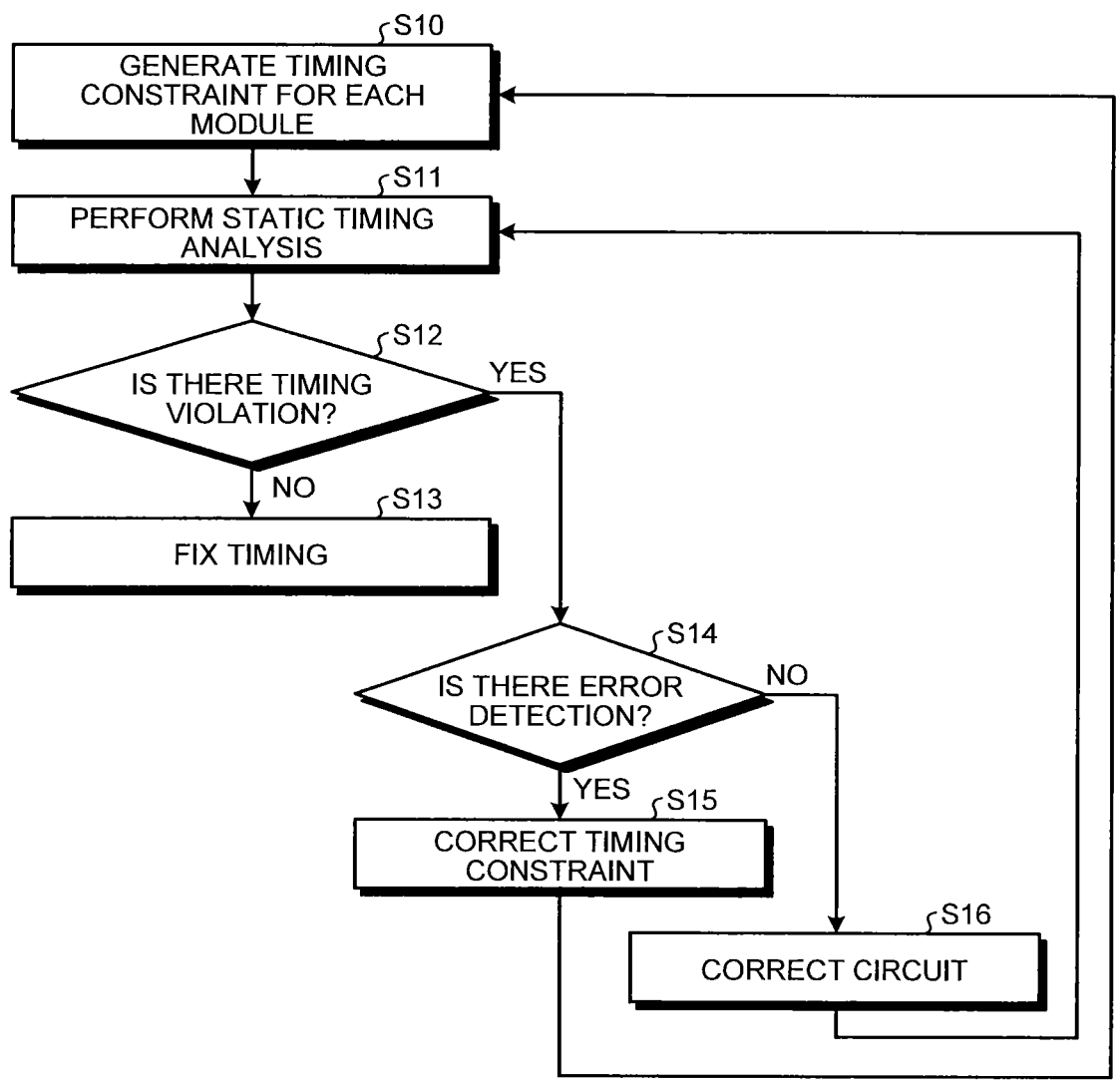
FIG. 15 is a flowchart that illustrates an example of static timing analysis.
Figure 16:
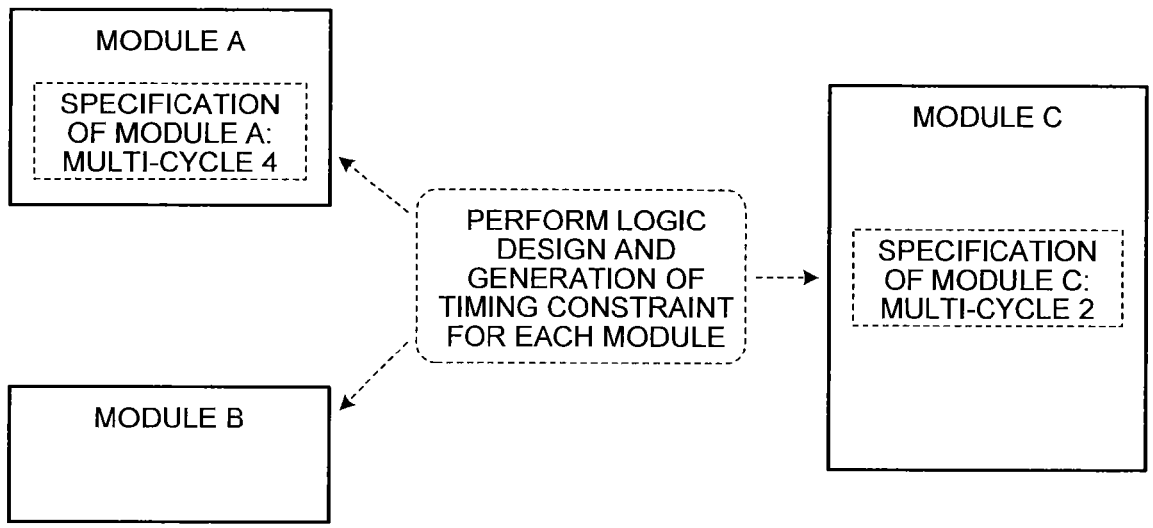
FIG. 16 is a diagram that illustrates an example of setting of timing constraints.
Figure 17:
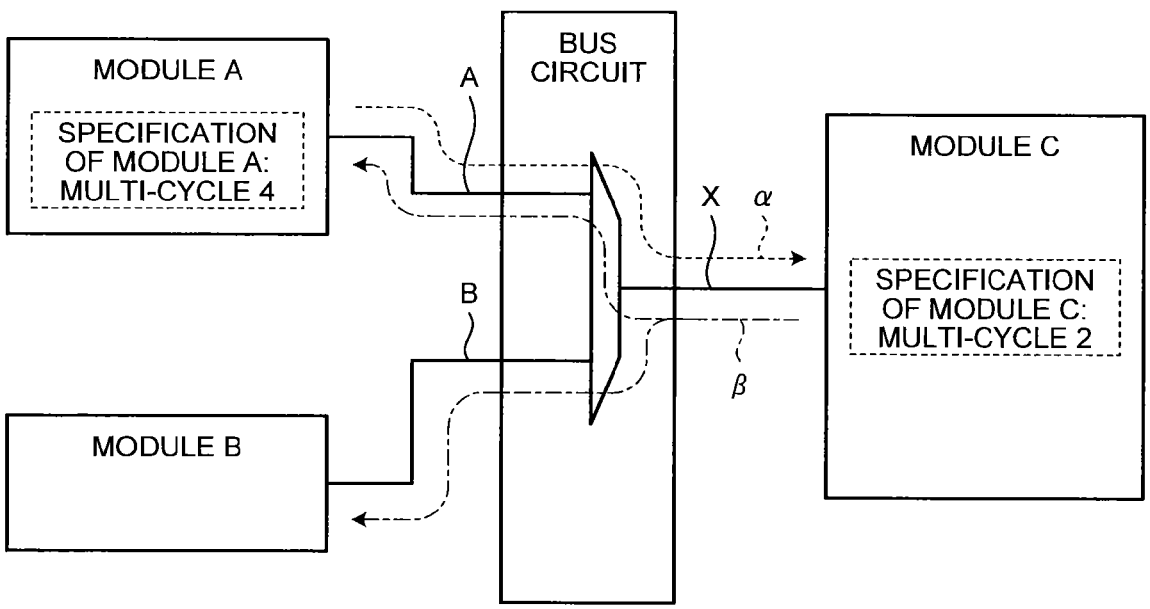
FIG. 17 is a diagram that illustrates a range to which a multi-cycle is applied.
Figure 18:
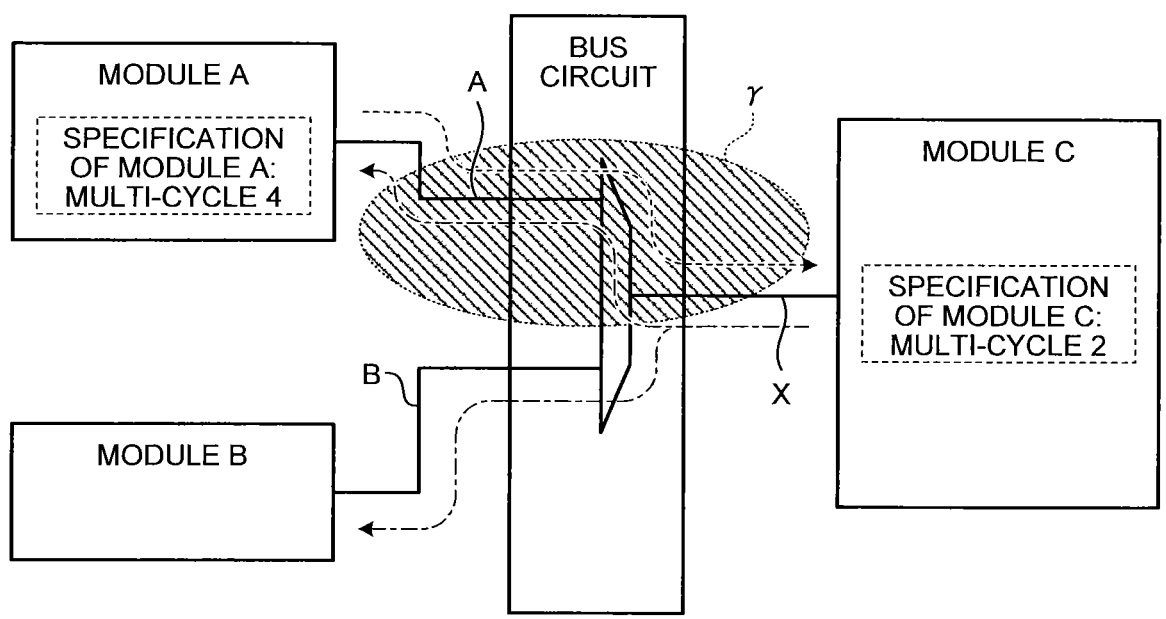
FIG. 18 is a diagram that illustrates an overlap of timing constraints.

In the timing constraint generating support apparatus 2 according to First Embodiment, a case has been described in which various processes are realized by hardware. However, the embodiment is not limited thereto, but the processes may be realized by executing a program that is prepared in advance using a computer included in the timing constraint generating support apparatus. Thus, hereinafter, an example of a computer that executes a timing constraint generating support program that has the same function as that of the timing constraint generating support apparatus illustrated in First Embodiment will be described with reference to FIG. 13. FIG. 13 is a diagram that illustrates an example of the computer that executes the timing constraint generating support program.

In a computer 100 illustrated in FIG. 13 as an example, a random access memory (RAM) 120, a read only memory (ROM) 130, and a hard disk drive (HDD) 150 are interconnected through a bus 170. In addition, in the computer 100 illustrated in FIG. 13, a central processing unit (CPU) 140 is connected to the bus 170. Furthermore, an input-output (I/O) 160 that is used for receiving circuit information and a timing constraint from the outside is connected to the bus 170.

In the HDD 150, instance information 151 and wire information 152 are stored in advance. Here, the instance information 151 is the same as the instance information that is stored in the instance information storing unit 5 according to First Embodiment. In addition, the wire information 152 is the same as the wire information that is stored in the wire information storing unit 6 according to First Embodiment.

In the ROM 130, a circuit information analyzing program 131, an instance information searching program 132, a wire information searching program 133, a propagation program 134, a determination program 135, and an output program 136 are stored in advance. By reading the programs 131 to 136 from the ROM 130 and executing the programs 131 to 136 using the CPU 140, in the example illustrated in FIG. 13, the programs 131 and 132 serve as a circuit information analyzing process 141 and an instance information searching process 142. In addition, the programs 133 to 136 serve as a wire information searching process 143, a propagation process 144, a determination process 145, and an output process 146. Furthermore, the processes 141 to 146 serve the same functions as those of the units 8 to 13 illustrated in FIG. 1.

The timing constraint generating support program described in this embodiment may be realized by executing programs prepared in advance using a computer such as a personal computer or a workstation. This program may be distributed through a network such as the Internet. This program is recorded in a computer-readable recording medium such as a hard disk, a flexible disk (FD), a compact disc read only memory (CD-ROM), a magneto optical disc (MO), or a digital versatile disc (DVD). In addition, this program may be executed by being read from a recording medium by a computer.

According to an aspect of the technology disclosed in this application, an error in the timing constraints is detected, and accordingly, the number of man-hours taken for determining whether or not the cause of a timing violation is an error in the timing constraints can be decreased.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A timing constraint generating support apparatus comprising:
   a memory; and
   a processor coupled to the memory, wherein the processor executes a process comprising:
      propagating, through a wire connecting logic circuits, timing constraints set for the logic circuits by using circuit information that represents information relating to the logic circuits and connection information that represents information of the wire;
      determining whether or not a plurality of timing constraints different from each other are propagated through the wire at the propagating; and
      outputting information representing that the timing constraints propagated through the wire overlap each other in a case where the plurality of timing constraints different from each other are determined to be propagated through the wire by the at the determining.

2. The timing constraint generating support apparatus according to claim 1, wherein the determining determines that a plurality of timing constraints different from each other are propagated through the wire in a case where the plurality of timing constraints of same type are propagated through the wire at the propagating, and values set by the timing constraints are different from each other.

3. The timing constraint generating support apparatus according to claim 2, wherein the timing constraints designate multi-cycles.

4. The timing constraint generating support apparatus according to claim 1, wherein the propagating propagates, through the wire, the timing constraints set for the logic circuits by using the circuit information and the connection information and using a condition that represents whether or not the timing constraints are propagated through the wire.

5. The timing constraint generating support apparatus according to claim 1, wherein the outputting outputs a circuit diagram in which a portion of the wire is highlighted in a case where it is determined that the plurality of timing constraints different from each other are determined to be propagated through the wire at the determining.

6. The timing constraint generating support apparatus according to claim 1, wherein the information being output at the outputting is wire information representing an overlapping wire determined at the determining.

7. A non-transitory computer-readable recording medium storing therein a timing constraint generating support program for causing a computer to execute a process comprising:
   propagating, through a wire connecting logic circuits, timing constraints set for the logic circuits by using circuit information that represents information relating to the logic circuits and connection information that represents information of the wire;
   determining whether or not a plurality of timing constraints different from each other are propagated through the wire at the propagating; and
   outputting information representing that the timing constraints propagated through the wire overlap each other in a case where the plurality of timing constraints different from each other are determined to be propagated through the wire at the determining.

8. A method of supporting generation of timing constraints, the method comprising:
   propagating, using a processor, through a wire connecting logic circuits, timing constraints set for the logic circuits by using circuit information that represents information relating to the logic circuits and connection information that represents information of the wire;
   determining, using a processor, whether or not a plurality of timing constraints different from each other are propagated through the wire at the propagating; and
   outputting information representing that the timing constraints propagated through the wire overlap each other in a case where the plurality of timing constraints different from each other are determined to be propagated through the wire at the determining.

* * * * *